United States Patent [19]

Isaac et al.

[11] Patent Number: 4,495,512
[45] Date of Patent: Jan. 22, 1985

[54] SELF-ALIGNED BIPOLAR TRANSISTOR WITH INVERTED POLYCIDE BASE CONTACT

[75] Inventors: Randall D. Isaac; Tak H. Ning, both of Yorktown Heights, N.Y.

[73] Assignee: International Business Machines Corporation, Armonk, N.Y.

[21] Appl. No.: 385,740

[22] Filed: Jun. 7, 1982

[51] Int. Cl.[3] .................... H01L 23/48; H01L 29/46; H01L 29/72
[52] U.S. Cl. ...................................... 357/34; 357/67; 357/71
[58] Field of Search .......................... 357/34, 675, 715

[56] References Cited

U.S. PATENT DOCUMENTS

| 4,106,051 | 8/1978 | Dormer et al. ........................ 357/71 |
| 4,128,670 | 12/1978 | Gaensslen .............................. 427/86 |
| 4,157,269 | 6/1979 | Ning et al. ............................ 148/1.5 |
| 4,252,582 | 2/1981 | Anantha et al. ..................... 148/175 |
| 4,276,557 | 6/1981 | Levinstein et al. ................... 357/67 |
| 4,329,706 | 5/1982 | Crowder et al. ..................... 357/71 |
| 4,378,628 | 4/1983 | Levinstein et al. ................ 357/675 |
| 4,392,150 | 7/1983 | Courreges ............................ 357/67 |
| 4,398,335 | 8/1983 | Lehrer ................................... 357/71 |
| 4,398,341 | 8/1983 | Geipel, Jr. et al. .................. 357/67 |
| 4,418,468 | 12/1983 | Vora et al. .......................... 357/715 |

FOREIGN PATENT DOCUMENTS 51500 12/1982 European Pat. Off. .

OTHER PUBLICATIONS

"Fabrication of Conductive Refractory Silicide–Doped Polysilicon Lines", Baglin et al., IBM Tech. Disclosure Bull., vol. 20, No. 10, Mar. 1978, p. 4189.

"Method of Fabricating MOSFET Integrated Circuits w/Low Resistivity Interconnection Lines", Rideout, IBM Tech. Disc. Bull., vol. 23, No. 6, Nov. 1980, p. 2563.

"Enhanced Polycide Structures", Campbell et al., IBM Tech. Disc. Bull., vol. 25, No. 4, Sep. 1982, p. 1920.

Bipolar Transistor Structure with Extended Metal Base Contacts and Diffused or Implanted Emitter—IBM TDB, vol. 22, No. 5, Oct. 1979, pp. 2123-2126.

*Primary Examiner*—Andrew J. James
*Assistant Examiner*—John LaMont
*Attorney, Agent, or Firm*—Carl C. Kling

[57] ABSTRACT

An inverted polycide extrinsic base contact serves as a diffusion source, yet still has low resistivity and is readily etchable down to silicon by techniques useful in manufacturing integrated circuits. The extrinsic base contact layer is made up of a metal silicide (e.g. $WSi_2$) with an overlying doped polysilicon layer with coextensive apertures through doped polysilicon and metal silicide layers defining the emitter and intrinsic base region.

The extrinsic base region is formed by diffusing boron impurities from the p+ polysilicon layer through the silicide layer. The silicide layer is of a metal silicide such as tungsten silicide ($WSi_2$). The polysilicon layer acts as a diffusion source, since appropriate dopants (e.g., boron) diffuse rapidly through the metal silicide. Both the top surface of the p+ polysilicon layer and the sidewall edges of the polysilicon and silicide layers are covered by an insulating layer (e.g. $SiO_2$) which also separates the emitter contact from the base contact layers.

3 Claims, 5 Drawing Figures

SELF-ALIGNED BIPOLAR TRANSISTOR WITH INVERTED POLYCIDE BASE CONTACT

BACKGROUND OF THE INVENTION

Field of the Invention

This invention relates to self-aligned bipolar transistors and particularly to the structure and fabrication technique of a self-aligned bipolar transistor with an inverted polycide extrinsic base contact.

In a transistor integrated circuit, individual transistor devices are defined by relatively small differences of structure due to different doping materials which alter the conductivity for related polarities of electrical potentional, and by insulation layers grown as oxides or otherwise introduced. All items forming the individual devices are closely related in physical proximity, integrated into a single integrated circuit chip. An individual device may have emitter, base and collector, and be defined by relatively inactive surrounding material, all formed from the same silicon material through doping processes or the lack of doping. The active elements of a planar transistor may all be embedded within the silicon chip, and may be remarkably tiny. The emitter may be a small spot on the surface, extending for only a small distance into the bulk of the chip. The base may be even thinner, and be essentially hidden below the emitter, within the bulk of the chip. The collector may underlie the base and be completely submerged under the emitter and base, but extend outward so as to present itself for electrical contact at the surface. The base may have two regions of interest, the active base region (intrinsic base) under the emitter, and the inactive base region (extrinsic base) near the base contact.

Those skilled in the art of transistor integrated circuits understand the active function of the intrinsic base as contrasted to the conductivity function of the extrinsic base. "All the base current must flow through the inactive region, and the current path is through material of finite cnductivity. This portion of the path can be simulated by a fixed resistor in series with the base lead. It is called the 'extrinsic' base resistance because it is outside the active region . . . Over a considerable range of current it is possible to represent the effect by an 'intrinsic' base resistance added to the extrinsic base resistance." Paul E. Gray, David DeWitt, A. R. Boothroya and James F. Gibbons, Physical Electronics and Circuit Models of Transistors, John Wiley & Sons, New York, Refractory metals or silicides of refractory metals have been used as base contacts to which the emitter of a bipolar transistor is self-aligned. This reduces the extrinsic base area and the series resistance of the extrinsic base of the bipolar transistor. T. H. Ning and H. N. Yu, "Bipolar Transistor Structure with Extended Metal Base Contacts and Diffused or Implanted Emitter," IBM Technical Disclosure Bulletin, Vol. 22, No. 5, October 1979, pages 2123-2126. However, this structure does not allow independent doping of the extrinsic and intrinsic base regions.

An alternative process uses p$^+$ polysilicon as both a base contact and a diffusion source for the extrinsic base. U.S. Pat. No. 4,157,269, T. H. Ning and H. N. Yu, "Utilizing Polysilicon Diffusion Sources and Special Masking Techniques," June 5, 1979. The sheet resistivity of p! polysilicon is considerably higher ($\sim 100\Omega$/square) than that of silicides ($\sim 3\Omega$/square). A diffusion doping technique for forming intrinsic base and extrinsic base regions in transistor integrated circuits is described at Column 2, Lines 60-65. Those skilled in the art have come to refer to a stack of successive layers of silicon dioxide, doped polysilicon and a metal silicide as a "polycide" stack, and to refer to polysilicon as "polysi." The function of the metal silicide in the polycide stack is to lower the resistance. The function of the polysi is to insulate the silicide from possibly reactive materials and gases. The function of the silicon dioxide is passivation and insulation.

The conventional polycide stack of doped polysilicon with a layer of silicide on top is difficult to pattern with either reactive ion etching or preferential chemical etchants in the fabrication of bipolar transistor structures where the polycide is etched down to silicon as opposed to the fabrication of FET structures where the polycide is etched down to SiO$_2$.

SUMMARY OF THE INVENTION

An object of this invention is to provide a self-aligned bipolar transistor structure using as the base contact an inverted polycide which can serve as a diffusion source and still have low resistivity.

Another object of the invention is to provide an inverted polycide stack, i.e., polysilicon layer on top of silicide layer, as the base contact of bipolar transistors. This inverted polycide stack can be readily etched down to silicon.

DESCRIPTION OF THE PREFERRED EMBODIMENT

Figure 1:
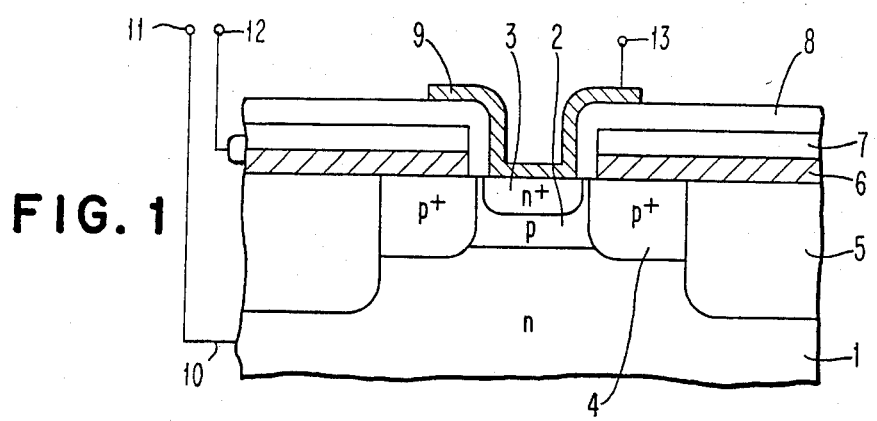
FIG. 1 is an illustration of the bipolar transistor structure of the invention.

FIG. 1 shows the preferred embodiment self-aligned bipolar transistor using an inverted polycide stack as the base contact.

The inverted polycide stack in the self-aligned bipolar transistor of FIG. 1, with the doped polysilicon on top of the silicide layer, can be readily etched with carbon tetrafluoride plus oxygen (CF$_4$+O$_2$) in a flexible diode system with an etch ratio about 3-5:1 silicide:silicon. This is important in the bipolar structure where polycide is etched down to silicon. The inverted polycide stack can still be used as a diffusion source, since boron diffuses rapidly through the metal silicide.

In FIG. 1, collector 1, base 2 and emitter 3 form the vertical bipolar transistor. This transistor is one of many which may be integrated into an integrated circuit. Extrinsic base region 4 is formed by diffusing boron impurities from the p$^+$ polysilicon layer 7 through the silicide layer 6. Silicide layer 6 is of a metal silicide, for example tungsten silicide (WSi$_2$). Both the top surface of p$^+$ polysilicon 7 and the vertical edges of p$^+$ polysilicon layer 7 and silicide layer 6 are covered by SiO$_2$ insulating layer 8, which also separates the emitter contact 9 from the base contact layers 6 and 7. Collector extension 10 and contacts 11, 12 and 13 are shown schematically in FIG. 1.

FABRICATION TECHNIQUE

FIGS. 2A, 2B, 2C and 2D show a process sequence by which the self-aligned npn bipolar transistor device of FIG. 1 may be prepared. The n+ buried layer, epitaxial layer, reach though, isolation etc. are assumed to be in place and are not a part of this invention.

Figure 2A:
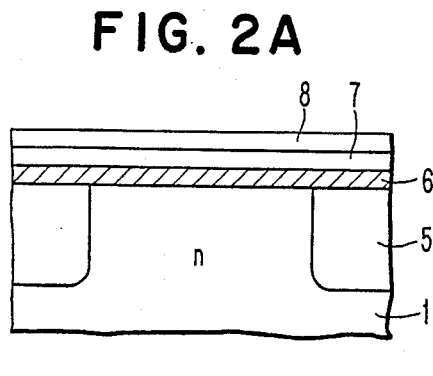
FIGS. 2A, 2B, 2C and 2D form a composite drawing showing the method for producing the bipolar transistor structure of FIG. 1.

FIG. 2A shows the collector region 1 with a silicon dioxide layer 5 delimiting a particular transistor device area. Silicide layer 6, p+ polysilicon layer 7, and silicon dioxide layer 8 are deposited in turn over the transistor device areas.

Figure 2B:
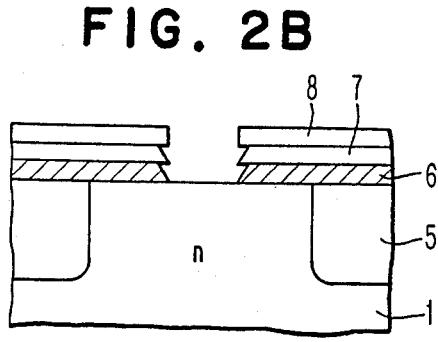

FIG. 2B shows the same transistor device area after a masking and etching sequence to position the emitter and intrinsic base region by preparing an aperture through the layers. These steps are:

1. form the emitter opening in the photoresist layer (not shown),
2. reactive ion etch (RIE) oxide layer 8,
3. RIE polysilicon layer 7 (e.g. in $CF_4 + 60\% \ O_2$ plasma),
4. RIE silicide layer 6 (e.g. in $CF_4 + 20\% \ O_2$ plasma),
5. strip resist.

Figure 2C:
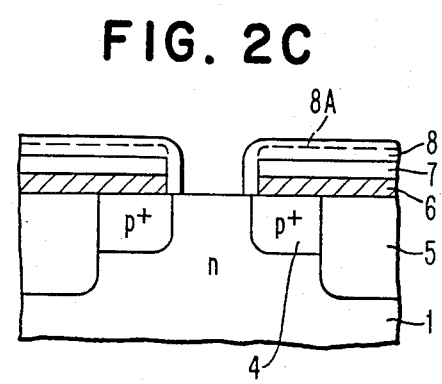

FIG. 2C shows the transistor device area after the steps required to prepare the sidewall insulating layer covering the extrinsic base contact to which the emitter will be self-aligned. These steps are:

1. deposit oxide layer 8A,
2. drive-in boron to dope the extrinsic base region 4,
3. RIE the deposited oxide layer 8A on horizontal surfaces but not the sidewall oxide covering the vertical edges of the extrinsic base contact layers 6–7.

Figure 2D:
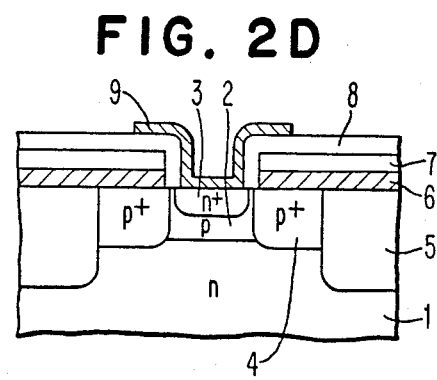

FIG. 2D illustrates the steps necessary to complete the transistor. These steps are:

1. form emitter 3 and base 2 using standard techniques,
2. form emitter contact 9, and
3. form contact (not shown) to the inverted polycide extrinsic base contact layers 6–7 using standard techniques.

It is obvious to those skilled in the art that the process sequence described above for fabricating a self-aligned npn bipolar transistor can be followed to fabricate a self-aligned pnp bipolar transistor by using silicon and polysilicon doped with impurities of the opposite polarity.

What is claimed is:

1. A self-aligned bipolar transistor structure having a metal silicide layer covering the extrinsic base region about an aperture defining the emitter and intrinsic base region characterized by:
   a doped polysilicon layer covering said metal silicide layer and having the same aperture.

2. A self-aligned bipolar transistor structure according to claim 1, further characterized in that the metal silicide is tungsten silicide ($WSi_2$) and in that said polysilicon layer is boron doped polycrystalline silicon.

3. A self-aligned bipolar transistor structure characterized by:
   a. n-type collector 1, p-type intrinsic base 2 and n+ emitter 3, with associated contacts 11, 12 and 13, related to a device area in a silicon chip;
   b. a doped silicon device region 1–4, limited in area by a circumscribing silicon dioxide region 5 in said chip;
   c. a metal silicide layer 6 covering said device region 1–4 and having an aperture within the area of said device;
   d. a p+ polysilicon layer 7 covering said metal silicide layer 6 and having the same aperture, connected to said base contact 12;
   e. a p+ doped extrinsic base region 4 located underneath said metal silicide layer 6 and in said device region 1–4, in the area complementary to the aperture, and having the same dopant agent as the p+ polysilicon layer 7, the agent being of a type which passes at process temperature through metal silicide of thickness and composition equivalent to that of said metal silicide layer 6, contacting said metal silicide layer 6;
   f. an insulating layer 8 covering the surface of said P+ polysilicon layer 7 and the edges of said p+ polysilicon layer 7 and said metal silicide layer 6 at the aperture;
   g. an n+ doped emitter region 3, within said device region, in the location defined by the aperture and by said p-type intrinsic base region 2; and
   h. emitter metallization 9 covering said emitter region 3 and insulated from said p+ polysilicon layer 7 and from the edges of said p+ polysilicon layer 7 and said metal silicide layer 6 at the aperture by said insulating layer 8.

* * * * *